(12) United States Patent
Abhishek et al.

(10) Patent No.: US 12,259,764 B2
(45) Date of Patent: Mar. 25, 2025

(54) ARCHITECTURE FOR MANAGING ASYNCHRONOUS RESETS IN A SYSTEM-ON-A-CHIP

(71) Applicant: NXP USA, Inc., Austin, TX (US)

(72) Inventors: Kumar Abhishek, Bee Cave, TX (US); Neha Srivastava, New Delhi (IN); Yi Zheng, Austin, TX (US); Nishant Kumar, Noida (IN)

(73) Assignee: NXP USA, Inc., Austin, TX (US)

( * ) Notice: Subject to any disclaimer, the term of this patent is extended or adjusted under 35 U.S.C. 154(b) by 48 days.

(21) Appl. No.: 18/315,678

(22) Filed: May 11, 2023

(65) Prior Publication Data

US 2024/0192745 A1    Jun. 13, 2024

(30) Foreign Application Priority Data

Dec. 7, 2022    (IN) ............................. 202211070615

(51) Int. Cl.
*G06F 1/24*    (2006.01)
(52) U.S. Cl.
CPC ...................................... *G06F 1/24* (2013.01)
(58) Field of Classification Search
CPC ........................................................ G06F 1/24
USPC ........................................................ 327/142
See application file for complete search history.

(56) References Cited

U.S. PATENT DOCUMENTS

| | | | |
|---|---|---|---|
| 6,480,967 B1 | 11/2002 | Jensen et al. | |
| 6,654,898 B1* | 11/2003 | Bailey | G06F 1/3237 713/1 |
| 6,711,691 B1* | 3/2004 | Howard | G06F 1/3203 713/320 |
| 7,594,211 B1 | 9/2009 | Tian et al. | |
| 9,685,957 B2 | 6/2017 | How | |
| 10,775,871 B2 | 9/2020 | Garg et al. | |
| 2004/0100310 A1* | 5/2004 | Kurakane | G06F 1/324 327/114 |
| 2005/0190627 A1* | 9/2005 | Nakatake | H03L 7/08 365/226 |
| 2008/0100355 A1* | 5/2008 | Omote | H03L 7/093 327/158 |
| 2012/0124407 A1 | 5/2012 | Shimizu | |
| 2014/0118035 A1* | 5/2014 | Yamashida | G11C 7/222 327/143 |
| 2019/0079835 A1* | 3/2019 | You | G06F 11/1497 |

FOREIGN PATENT DOCUMENTS

| CN | 203909710 U | * 10/2014 |
|---|---|---|
| CN | 106502357 A | 7/2019 |

* cited by examiner

*Primary Examiner* — Tomi Skibinski (57) ABSTRACT

Systems and methods for managing asynchronous resets in an SoC have been described. In an illustrative, non-limiting embodiment, a reset generation circuit in an SoC, may include a first reset generation circuit configured to enable a first reset signal based, at least in part, upon a clock signal and an indication to reset. The reset generation circuit may also include a second reset generation circuit coupled to the first reset generation circuit, in which the second reset generation circuit is configured to enable a second reset signal after the first reset signal is enabled. The first reset signal and the second reset signal are both provided to a component of the SoC.

19 Claims, 9 Drawing Sheets

ARCHITECTURE FOR MANAGING ASYNCHRONOUS RESETS IN A SYSTEM-ON-A-CHIP

CROSS-REFERENCE TO RELATED APPLICATIONS

This application claims the priority under 35 U.S.C. § 119 of India application No. 202211070615, filed on Jul. 12, 2022, the contents of which are incorporated by reference herein.

FIELD

This disclosure relates generally to electronic circuits, and more specifically, to systems and methods for managing an asynchronous resets in a System-On-a-Chip (SoC).

BACKGROUND

In a computer or data transmission system, a "reset" is an instruction or signal that, once received, brings the computer or data transmission system to its normal operating condition or some initial state, in a controlled manner. Resets can be triggered, for instance, in response to error conditions that make it impossible or undesirable for a processing activity to proceed, and other error recovery mechanisms fail. For example, a computer program would normally perform a reset if a command times out and error recovery schemes like retry or abort also fail.

Most computers have a reset line that brings the device into the startup state and is active for a short time after powering on. In some cases, asserting a reset line can halt a Central Processing Unit (CPU). This can be done after the computer is switched on and before its Power Supply Unit (PSU) has asserted a "power good" signal, which indicates that the PSU is ready to supply stable voltages at sufficient power levels. Resets can place less stress on the hardware than power cycling, as the power is not altogether removed.

A reset can be asynchronous or synchronous. An asynchronous reset activates as soon as the reset signal is asserted. Conversely, a synchronous reset activates on an active clock edge after the reset signal is asserted.

Many computers, especially older models, have user-accessible reset buttons that assert the reset line to facilitate a reboot in a way that cannot be trapped (i.e., prevented) by the computer's Operating System (OS). Out-of-band management also frequently provides the possibility to reset the remote system in this way.

Meanwhile, memory-capable digital circuits (flip-flops, registers, counters and so on) accept a reset signal that sets them to the pre-determined state. This signal is often applied after powering on; but may also be applied under other circumstances.

In that regard, a "destructive" reset can indicate that an event has occurred after which critical register or memory content can no longer be guaranteed. A destructive reset might reset an entire computer chip except for some clock and reset management portions of the chip. As another example, a "functional" reset can indicate that an event has occurred after which it can be guaranteed that critical register and memory content is still intact. A functional reset might reset an entire chip, except for some clock and reset management and debug portions.

BRIEF DESCRIPTION OF THE DRAWINGS

The present invention(s) are illustrated by way of example and are not limited by the accompanying figures, in which like references indicate similar elements. Elements in the figures are illustrated for simplicity and clarity and have not necessarily been drawn to scale.

DETAILED DESCRIPTION

In SoCs, resets can be categorized into at least three types, namely: power-on reset, destructive reset, and functional reset. During power-on reset and destructive reset, designs can reset asynchronously, thus causing glitches to propagate. These glitches on many occasions are harmless, but sometimes can cause serious problems.

A few systems where reset glitches occur include fusebox interfaces, Input/Output (I/O) ports, and analog interfaces. An asynchronous glitch on a fusebox interface, for example, can lead to inadvertent fuse burn which will make the part unusable in field. An asynchronous glitch on I/O port control can lead to glitches on board which may not be solvable on the board. Also, glitches at an analog interface, such as a phase-locked-loop (PLL) interface, can lead to incorrect state of the design which in turn may result in invalid responses.

Resolving these issues with gate level simulation can be unduly expensive, as it takes place very late in the design cycle. To address these, and other issues, embodiments of various systems and methods discussed herein provide an architecture for managing asynchronous resets in an SoC. These systems and methods can provide an architectural solution that addresses the root of reset-related problems while relieving circuit designers from having to perform additional gate-level simulations.

Particularly, in some embodiments, systems and methods described herein may generate "early" and "late" versions of a reset instruction or signal produced in an SoC, in order to manage race conditions that can appear due to large routes all over the chip. Thus, these systems and methods may help avoid catastrophic failures, which take significant time to debug and fix in the production line.

Some embodiments target a specific problem faced when a common protocol receives resets from multiple reset branches and hence randomly has functional violations because of the varied way the resets could be propagating in the reset tree. Other embodiments address this unique problem space that impact critical logic like fusebox, mixed-signal circuits (e.g., PLL, XOSC, ADC, etc.), and Pad safe-stating. Yet other embodiments fix these problems in an architecturally correct-by-construct manner in the reset controller itself, rather than by making ad-hoc reset tree delay adjustments (which can still fail across process, voltage, and temperature variations).

Figure 1:
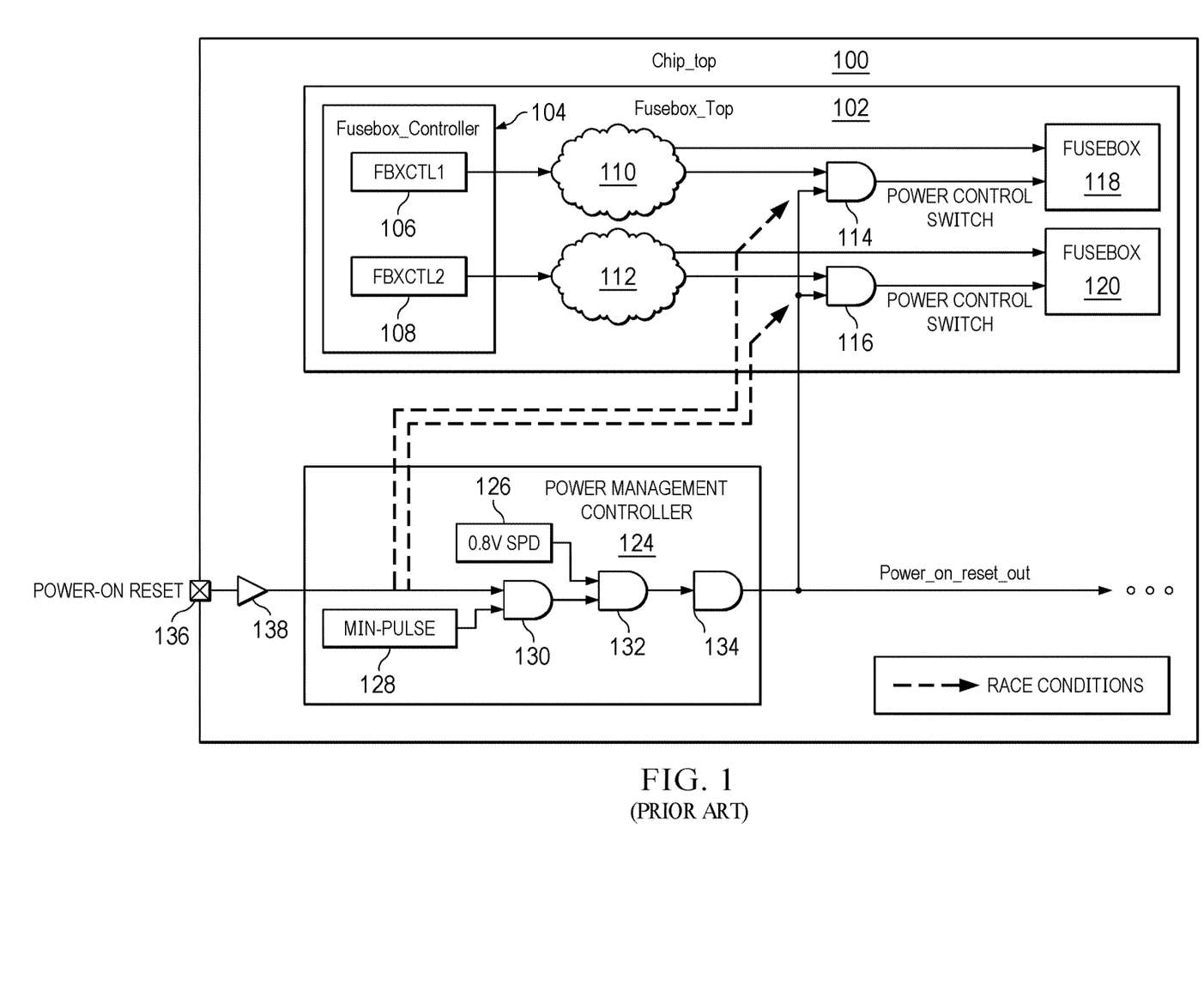
FIG. 1 is a diagram of a reset being provided to a fusebox ("Prior Art").

FIG. 1 is a diagram of a reset being provided to a fusebox ("Prior Art"). The power control switch (PS) signals of the fuse box that are output from gates 114 and 116 respectively, protect spurious fuse burn. During power-on reset (POR) and destructive reset events, timing paths or race conditions are created to the PS signals from source of reset to safe state before the other fusebox controls intercept the reset.

If other fusebox control signals, such as address, data, and other miscellaneous signals enter a reset state before the PS signals are disabled (by the reset being enabled), then glitches can occur causing the fuses to be blown.

Race conditions are represented by the dashed lines in FIG. 1 that indicate signal propagation from the output of buffer 138 to the PS signals that enter the fuseboxes 118 and 120. Glitches can therefore be introduced on the signals from 110 to fusebox 118, or from 112 to fusebox 120 in these situations, which can cause blown fuses in the fuseboxes and potentially unusable SoCs.

In FIG. 1, a POR signal that can be input from a pad 136 of the computer chip 100. The diagram assumes that the POR is enabled or active in the low or "0" state of the reset signal. The POR signal can travel through a buffer 138 to a power management controller circuit or block 124.

The power management controller can include circuitry to manage and control the reset signal. The reset signal from the buffer 138 can be compared with a min-pulse signal 138 in AND gate 130. The output of AND gate 130 and be ANDed 132 with a signal output from a 0.8 V surge protective device (SPD) 126, which can be output into another AND gate 134 before propagating to fusebox system 102 of the computer chip 100.

AND gates 130, 132, 134, 116, and 114 may be added to the SoC's design process to try to optimize the timing paths of the reset signals in order to reduce or minimize the impact of race conditions.

The fusebox system 102 can include a fusebox controller 104 that outputs fusebox control signals such as FBXCTL1 106 and FBXCTL2 108. These fusebox control signals then propagate through circuits or logic blocks 110 and 112 to the actual fuseboxes 118 and 120. These control signals can be address, data, or other miscellaneous signals. The fuseboxes 118 and 120 also have a PS signal input to them from gates 114 and 116. These gates 114 and 116 can be AND gates that AND the reset signal output from the power management controller 124 with other signals that would generate a reset from the fusebox controller 104 that have propagated through circuits or logic blocks 110 and 112.

Figure 2:
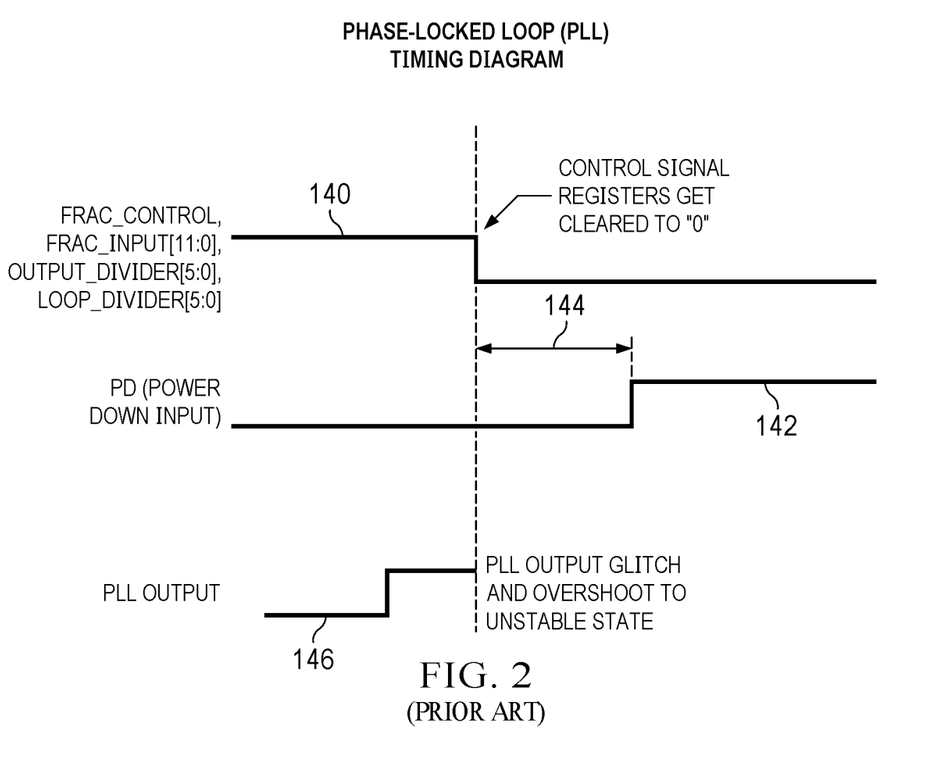
FIG. 2 is a timing diagram showing the operation of some signals in a conventional PLL circuit ("Prior Art").

FIG. 2 ("Prior Art") is a timing diagram showing the operation of some signals in a conventional PLL circuit. A phase-locked loop or phase lock loop (PLL) is a control system that generates an output signal whose phase is related to the phase of an input signal. In addition to synchronizing signals, a PLL can track an input frequency, or it can generate a frequency that is a multiple of the input frequency. These properties are used for computer clock synchronization, demodulation, and frequency synthesis.

FIG. 2 shows the situation where PLL power down (PD) input signal 142 comes delayed vs control signal registers 140 getting cleared early. Time period 144 shows this delay. This delay can cause the PLL to be operational with invalid control settings and a glitch on the PLL output 146 before partial system reset. For example, the PLL output 146 operates normally until the control registers (140) are lost, and then the PLL output 146 will become glitchy. When the PLL PD input signal (142) goes high, then the PLL output 146 will stop. SoC designers can try to ad-hoc fix this situation in gate level static timing analysis with a reduction in timing delay from functional reset source to the "PD" of the PLL before control settings are lost. However, this fix is not optimal since timing delays can vary from chip to chip.

The requirement is to not toggle the control signals of PLL when PD input signal is "0"; meaning the PLL is in a power-up state. Control signals should only be toggled when the PD input signal is in a "1" or power-down state. Because of the reset race condition to digital PLL circuitry or logic (controlling the signals to Analog PLL), control signals like output dividers, loop dividers, fractional divider control and fractional divider input are toggling before power down goes high. This can lead the PLL output 146 to glitch or overshoot to an unmet frequency.

Figure 3A:
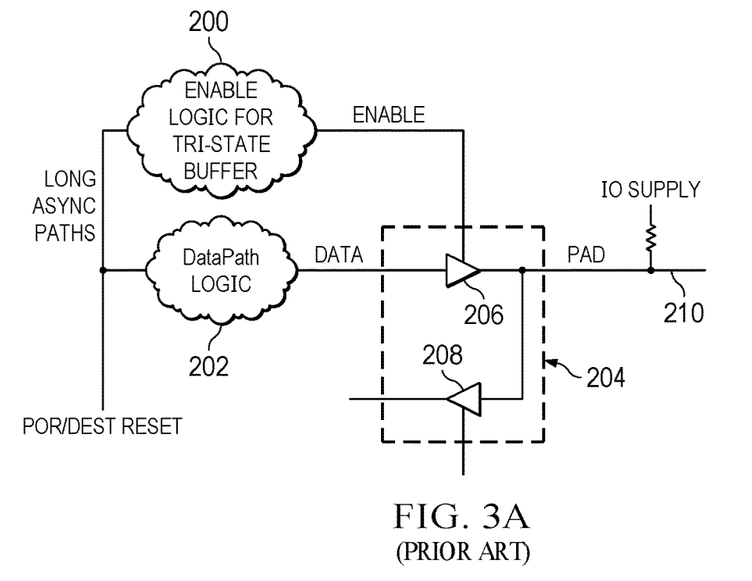
FIG. 3A is a diagram of a conventional I/O pad of a computer microchip, including a reset signal. ("Prior Art")

FIG. 3A ("Prior Art") is a diagram of a conventional I/O pad of a computer microchip, including a reset signal. FIG. 3A displays an asynchronous reset signal (POR/DEST RESET) from a long asynchronous reset path being input into enable logic 200 for one or more tri-state buffers 206 of the I/O pad circuit 204, and being input to datapath circuit or logic 202 that provides the data signal for the tri-state buffer 206.

The asynchronous reset signal can either be a POR or a destructive reset. The enable circuit or logic 200 provides an enable signal to the tri-state buffer 206. The datapath circuit or logic 202 provides a data signal to the tri-state buffer 206. The output of the I/O pad circuit is the PAD signal 210 that is connected to a pad through a resister shunted I/O supply. Tri-state buffer 208 is another tri-state buffer for use in the operation of the I/O pad circuit.

Figure 3B:
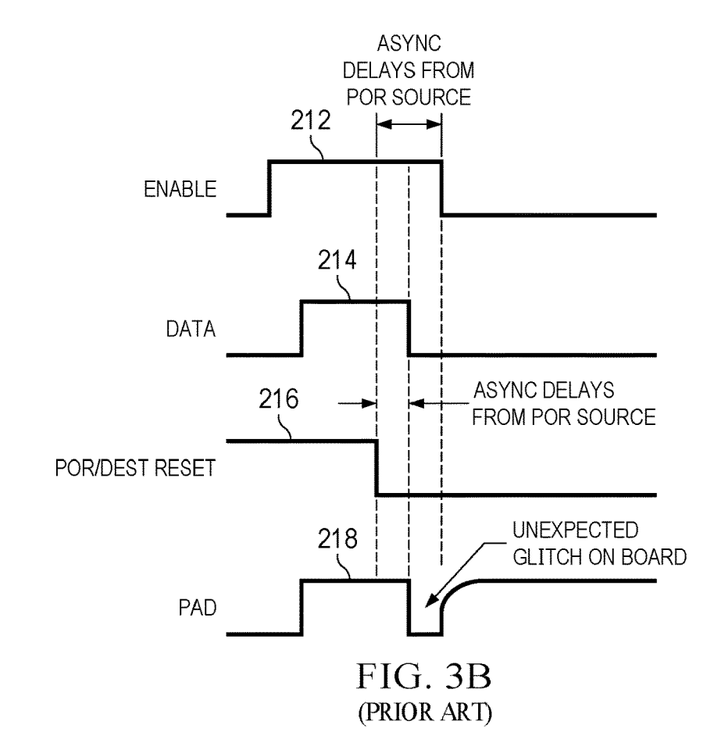
FIG. 3B is a timing diagram showing the operation of some signals in a conventional I/O pad. ("Prior Art")

FIG. 3B ("Prior Art") is a timing diagram showing the operation of some signals in the conventional I/O pad of FIG. 3A. FIG. 3B shows a POR or destructive reset signal (POR/DEST RESET 216) being enabled by transitioning from a high to a low state. However, there are asynchronous delays between the assertion of the reset signal 216 and the other signals the reset affects.

In this timing diagram, there are shorter asynchronous delays from the reset 216 assertion to the data signals 214 being cleared to a "0" or low state. There are longer asynchronous delays from the reset 216 assertion to the tri-state buffer enable signal 212 de-assertion. Therefore, the data 214 signal is cleared first before the tri-state enable signal is deactivated.

This causes the PAD signal 218 (which corresponds to PAD 210 in FIG. 3A) to have an unexpected glitch by transitioning from high to low state, before then being pulled back high by the resister-shunted I/O supply after the tri-state enable signal is deactivated.

Figure 4:
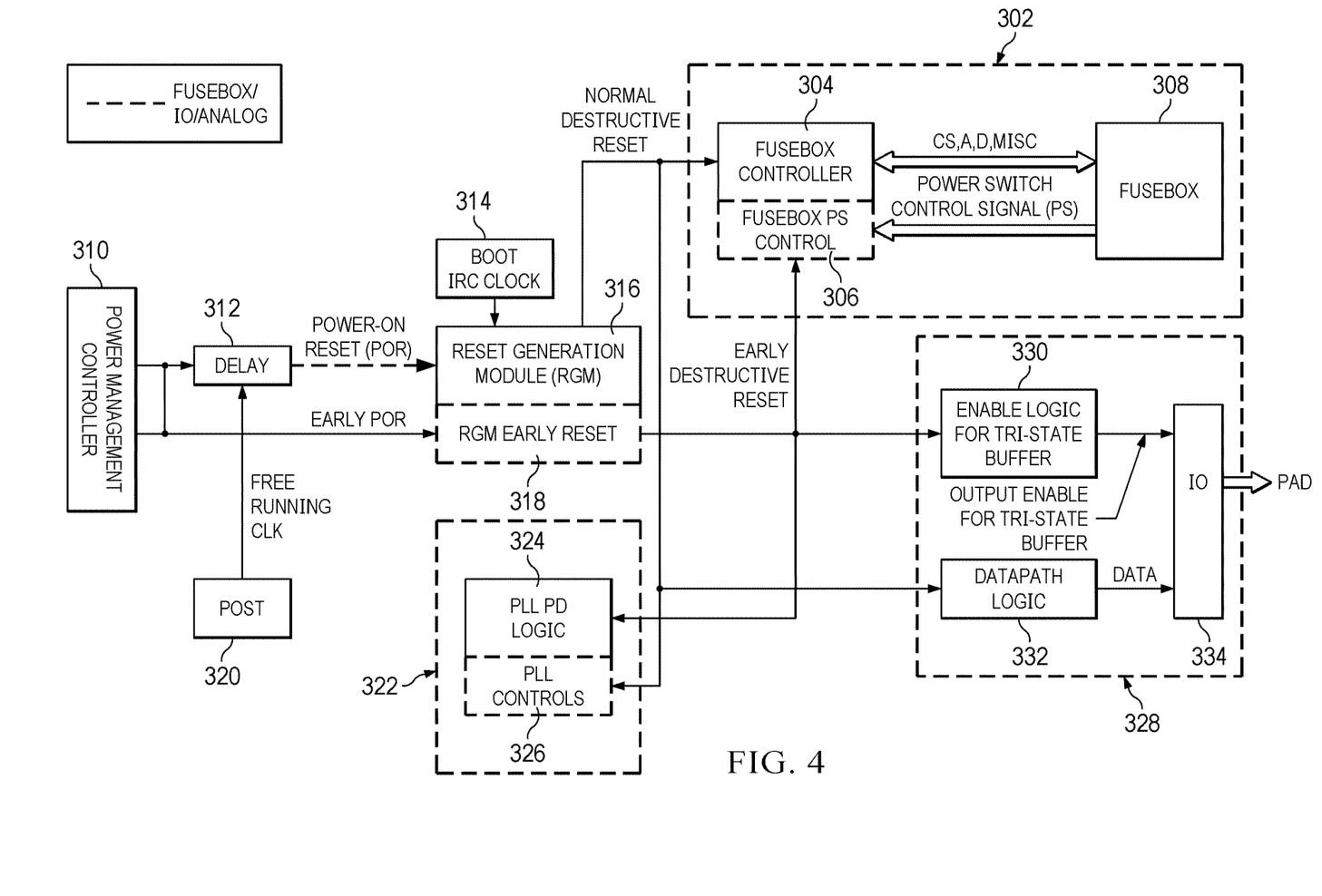
FIG. 4 is a system block diagram of some systems of an SoC showing the generation and use of "early" and "normal" versions of some reset signals, according to some embodiments.

FIG. 4 is a system block diagram of some systems of an SoC showing the generation and use of "early" and "normal" versions of some reset signals, according to some embodiments. Some embodiments of the disclosed architecture for managing asynchronous reset in an SoC generate "early" and "normal/late" versions of various reset signals, including POR, destructive reset (DEST), and functional reset (FUNC).

FIG. 4 displays POR and destructive reset generation and propagation. Destructive reset and functional reset are generated synchronously with Boot Clock (IRC) 314. They are generated in the reset generation module (RGM) 316 and the RGM for early reset 318. The POR reset is generated on process, voltage, and temperature (PVT) sensing, free running ring oscillators on chip, since the boot IRC clock stops on power-on reset. Particularly, PVT sensing free running ring oscillators on chip produce a free running clock from a Power-On Self-Test (POST) circuit or block 320.

In some embodiments, the power management controller 310 may generate the POR reset. The POR reset is broken into two signals, one which is input into a delay circuit 312 that delays the signal to produce the "normal/late" POR, while the POR that is not delayed is the "early" POR signal.

In various implementations, the default delay for the "early" vs. "normal/late" reset signals may be kept large enough to be greater than the routing and signal delay over entire die span, as well as any additional delay due to clock frequency variation. For safety, in some embodiments, a sequence detector can check if the timing relationship between "early" and "normal/late" reset signals fails due to a field defect, and can generate a fault. This is because reset paths usually are not covered during Built-In Logic Self-Test (BIST) for all possible defects.

FIG. 4 shows that fusebox "PS" control circuit or logic 306, of the fusebox system 302, resets with the "early" destructive reset from the RGM early reset circuit or block 318. Interface controls like Address, or Data, or Write select, or Chip select, etc., from the fusebox controller 304, resets on "normal" destructive reset from the RGM 316. This prevents fuses from being blown too soon in the fusebox 308.

In the I/O circuitry 328, the enable circuit or logic for the tri-state buffer 330 gets reset with "early" reset thus resetting all "port controls" in the I/O circuitry 334. The datapath circuit or logic 332 gets reset with the "normal" reset thus resetting data path after ports have been disabled.

For analog circuitry 322, such as a PLL, the Power Down (PD) of power management modules (or other critical modules), such as the PLL power-down (PD) circuit or logic 324, resets on "early" reset. The rest of the control registers in the PLL controls 326 reset on "normal" reset.

Destructive reset, such as early destructive reset from RGM early reset circuit or block 318 and normal destructive reset from the RGM circuit or block 316, gets generated synchronously with boot clock 314. POR (either early or normal reset) can get generated synchronously with a free running clock from the POST module 320, in some embodiments. In some embodiments, only the POR normal reset gets generated synchronously with the free running clock from the POST module 320. The POST module 320 can generate a free running ring oscillator clock for process analysis, for example.

Figure 5A:
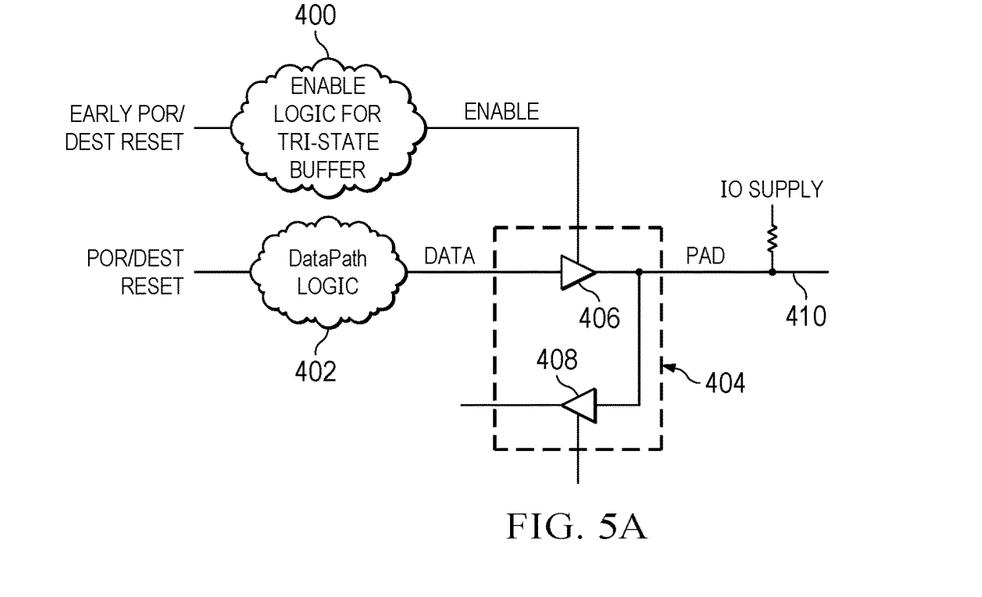
FIG. 5A is a diagram of an I/O pad according to some embodiments, where the I/O pad receives an early POR or early destructive reset, and a later POR or destructive reset.

FIG. 5A is a diagram of an I/O pad according to some embodiments, where the I/O system receives an early POR or early destructive reset, and a later POR or destructive reset. The early POR or destructive reset (early POR/DEST reset) is input to the enable circuit or logic for the tri-state buffer 400 which produces an enable signal for one or more tri-state buffers 406 in the I/O pad circuitry 404.

The later POR or destructive reset (referred to as POR/DEST reset) is input to the datapath circuit or logic 402 which provides the data signal to the tri-state buffer 406. The output of the I/O pad circuit 404 is the PAD signal 410 that is connected to a pad through a resister shunted I/O supply. Tri-state buffer 408 is another tri-state buffer for use in the operation of the I/O pad circuit.

Figure 5B:
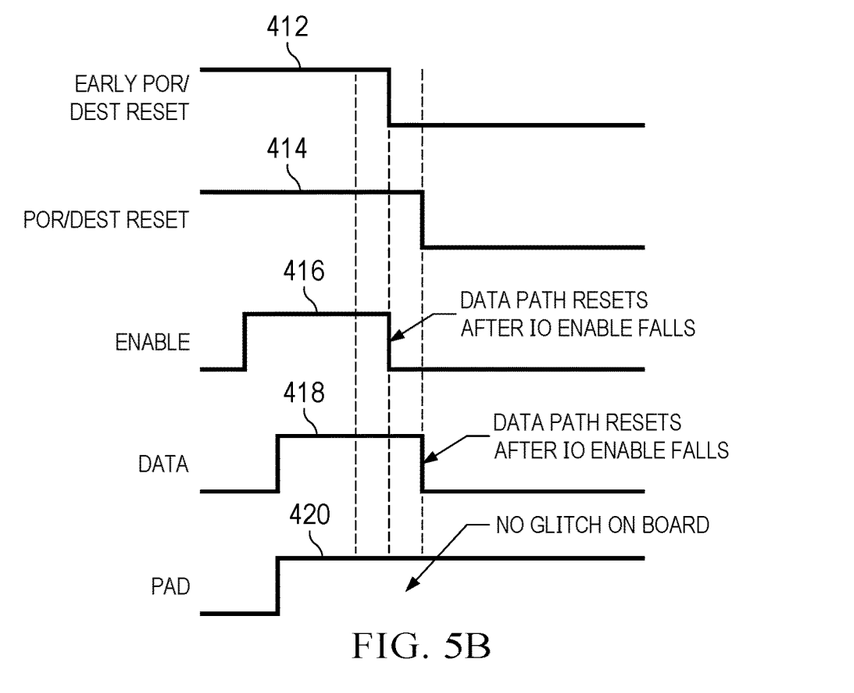
FIG. 5B is a timing diagram showing the operation of some signals of the I/O pad of FIG. 5A, according to some embodiments.

FIG. 5B is a timing diagram showing the operation of some signals of the I/O pad of FIG. 5A, according to some embodiments. In the timing diagram of FIG. 5B, the early POR/DEST reset signal 412 is enabled first (by transitioning from a "high" to a "low" value), while the POR/DEST reset signal 414 is enabled afterward. The enabling of the early reset 412 causes the enable signal 416 that enables the tri-state buffer to become de-asserted, which causes the tri-state buffers to become disabled.

The POR/DEST reset signal 414 being enabled causes the data signal 418 to become cleared sometime after the enable signal 416 is disabled. Because the I/O control is cleared (by the enable signal 416 being deasserted, i.e. transitioning from high to low) before the I/O datapath is cleared, then no glitch appears on the PAD 420 signal.

The glitch that previously appeared in the PAD 218 signal of FIG. 3B has been prevented because of the operation of the present embodiment.

Figure 6A:
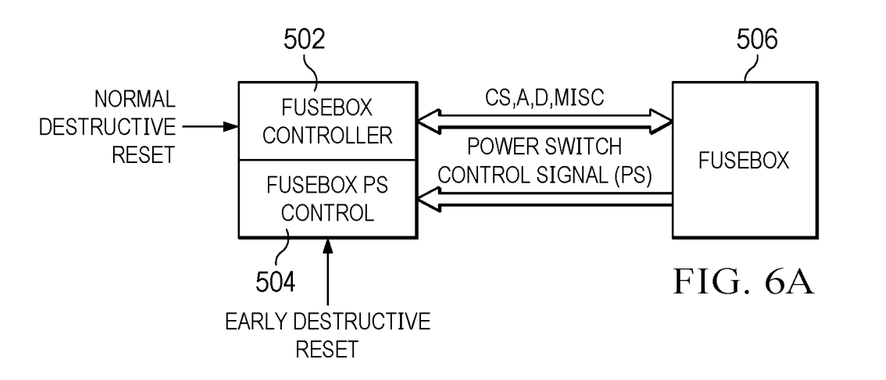
FIG. 6A is a diagram of an early destructive reset and a normal destructive reset being provided to different parts of a fusebox system of an integrated circuit, according to some embodiments.

FIG. 6A is a diagram of an early destructive reset and a normal destructive reset being provided to different parts of a fusebox system of an integrated circuit, according to some embodiments. The early destructive reset is provided to the fusebox PS control 504 circuitry, which provides the power switch control signal to the fusebox 506. The early reset 504 being enabled or asserted causes the power switch control signal to be disabled or in an "open" state. When the power switch is disabled or "open," the fusebox 506 is effectively disconnected from the rest of the circuitry. The normal destructive reset is provided to the fusebox controller 502 which provides the chip select (CS), address (A), data (D), and miscellaneous signals to the fusebox 506.

Figure 6B:
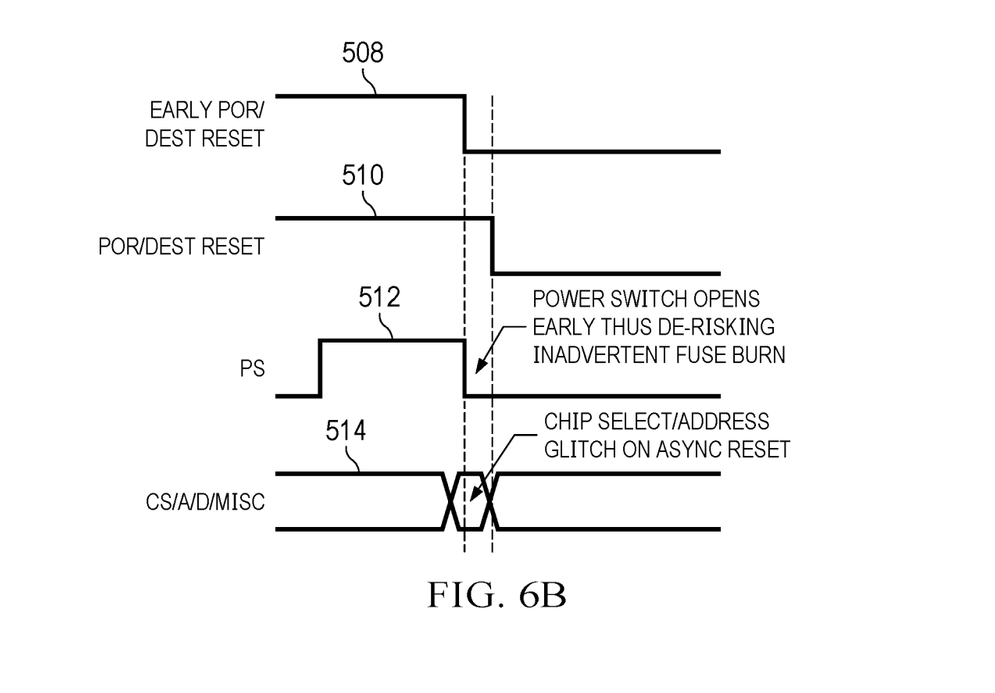
FIG. 6B is a timing diagram showing the operation of some signals of the fusebox system of FIG. 6A, according to some embodiments.

FIG. 6B is a timing diagram showing the operation of some signals of the fusebox system of FIG. 6A, according to some embodiments. In FIG. 6B, the early reset 508 is enabled first (by transitioning from a high to a low state) before the normal reset 510 is enabled (by transitioning from a high to a low state).

The early reset 508 being enabled or asserted causes the power switch control signal 512 to be disabled or in an "open" state. When the power switch is disabled or "open," the fusebox 506 is effectively disconnected from the rest of the circuitry.

Accordingly, it does not matter if there are glitches on the chip select (CS) address (A), data (D) or other miscellaneous signals 514 after the PS signal is "opened," because the fusebox is disconnected from those signals, such that fuses in the fusebox cannot be blown.

Figure 7:
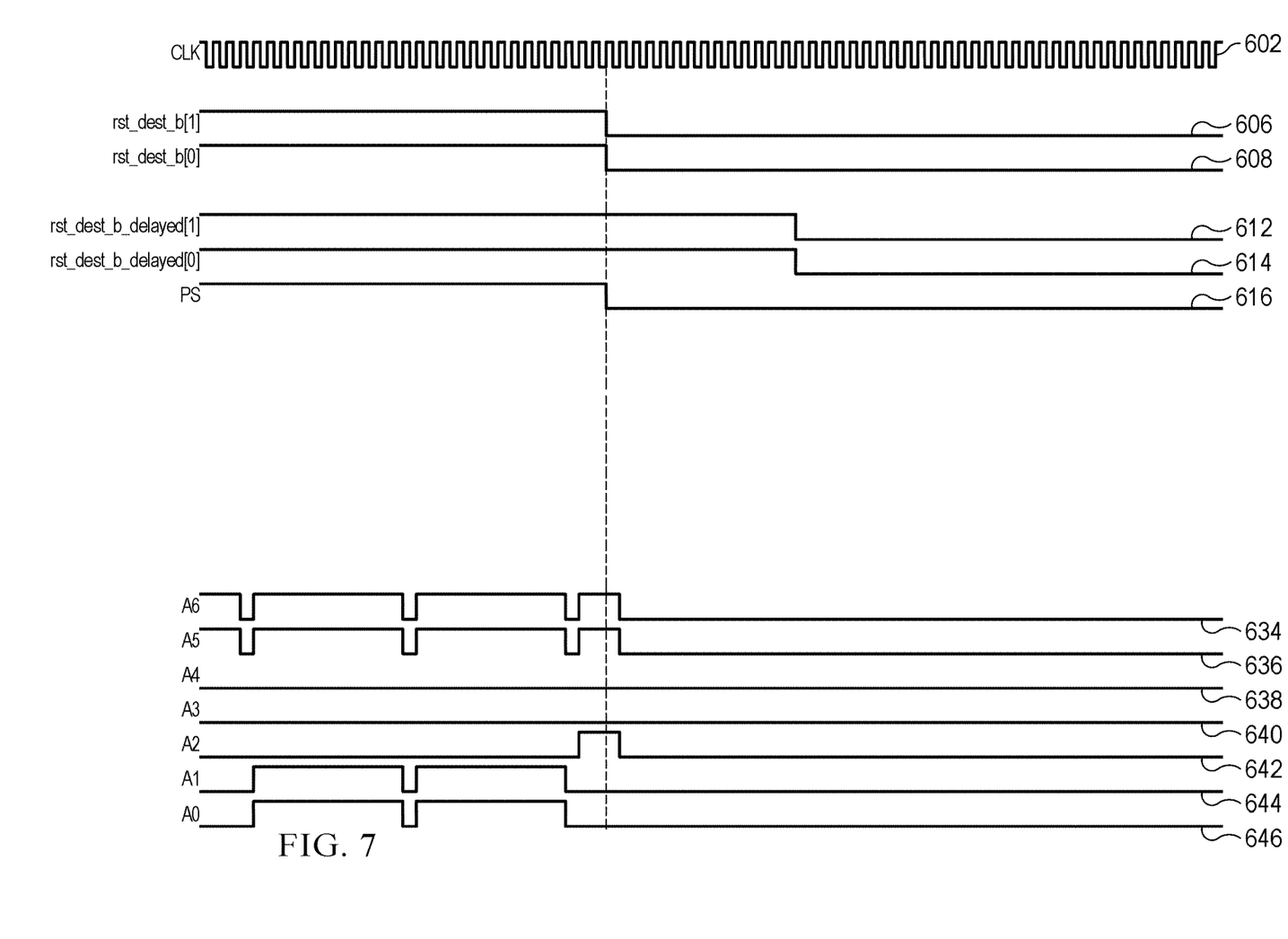
FIG. 7 is another timing diagram showing the operation of signals of another fusebox, according to some embodiments.

FIG. 7 is another timing diagram from an RTL simulation showing the operation of signals of another fusebox, according to some embodiments This timing diagram of FIG. 7 shows that the early reset rst_dest_b[1] 606 and rst_dest_b[0] 608 are asserted (by transitioning from a high to a low state) before the delayed reset rst_dest_b_delayed[1] 612 and rst_dest_b_delayed[0] 614 are asserted. Since these are synchronous resets, they are asserting on the transition of the clock CLK 602 signal.

The PS signal 616 is de-asserted or "opened" (by transitioning from a high to a low state) with the assertion of the early reset. Sometime after the PS signal 616 is opened, the address lines A6 through A0 (634, 636, 638, 640, 642, 644, and 646, respectively) are cleared.

Therefore, this RTL simulation shows that there is a PS signal 616 de-assertion before any "glitch" on address lines A6:A0 (634, 636, 638, 640, 642, 644, and 646, respectively).

Figure 8A:
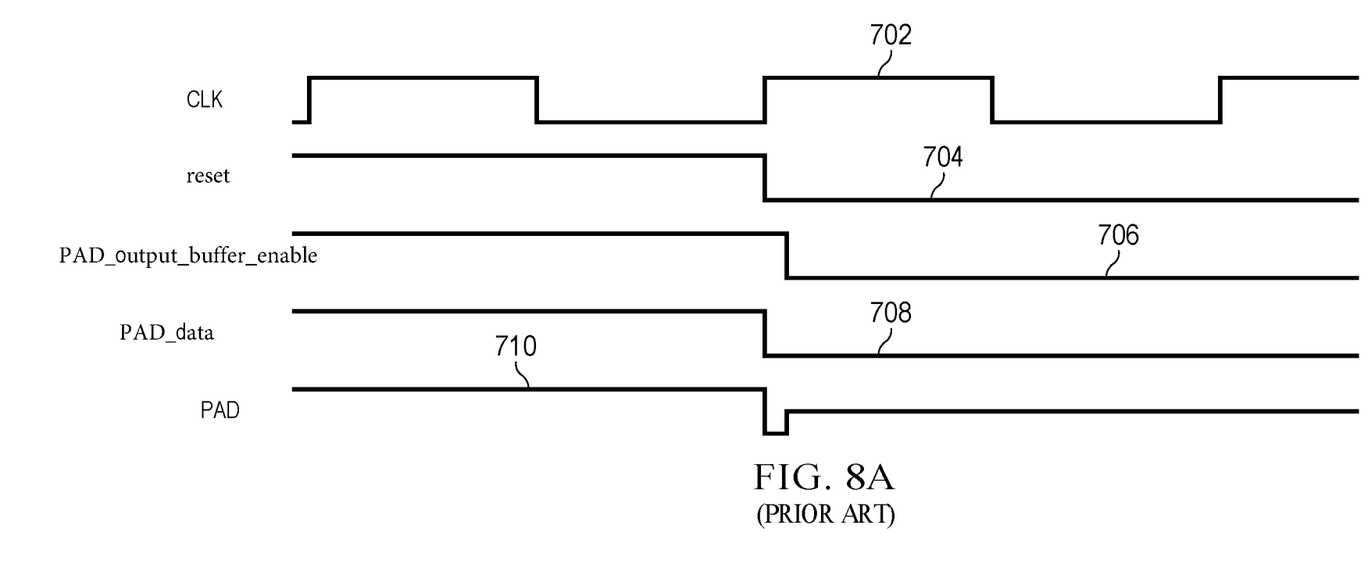
FIG. 8A is a timing diagram showing the operation of some signals in the conventional I/O pad. ("Prior Art")

FIG. 8A is a timing diagram from an RTL simulation showing the operation of some signals in the conventional I/O pad ("Prior Art"). FIG. 8A shows a reset signal 704 being enabled by transitioning from a high to a low state. However, there are asynchronous delays between the assertion of the reset signal 704 and the other signals the reset affects. In this timing diagram, there are shorter asynchronous delays from the reset 704 assertion to the data signals PAD_data 708 being cleared to a "0" or low state.

There are longer asynchronous delays from the reset 704 assertion to the tri-state buffer enable signal PAD_output_buffer_enable 706 de-assertion. Therefore, the PAD_data data signal 708 is cleared first before the tri-state enable signal 706 is deactivated. This causes the PAD signal 710 to have an unexpected glitch by transitioning from high to low state, before then being pulled back high by the resister-shunted I/O supply after the tri-state enable signal is deactivated.

Because this RTL simulation does not simulate the resister-shunted I/O supply connected to the PAD signal, the PAD_092 signal 710 transitions to an unknown state after the glitch low.

Figure 8B:
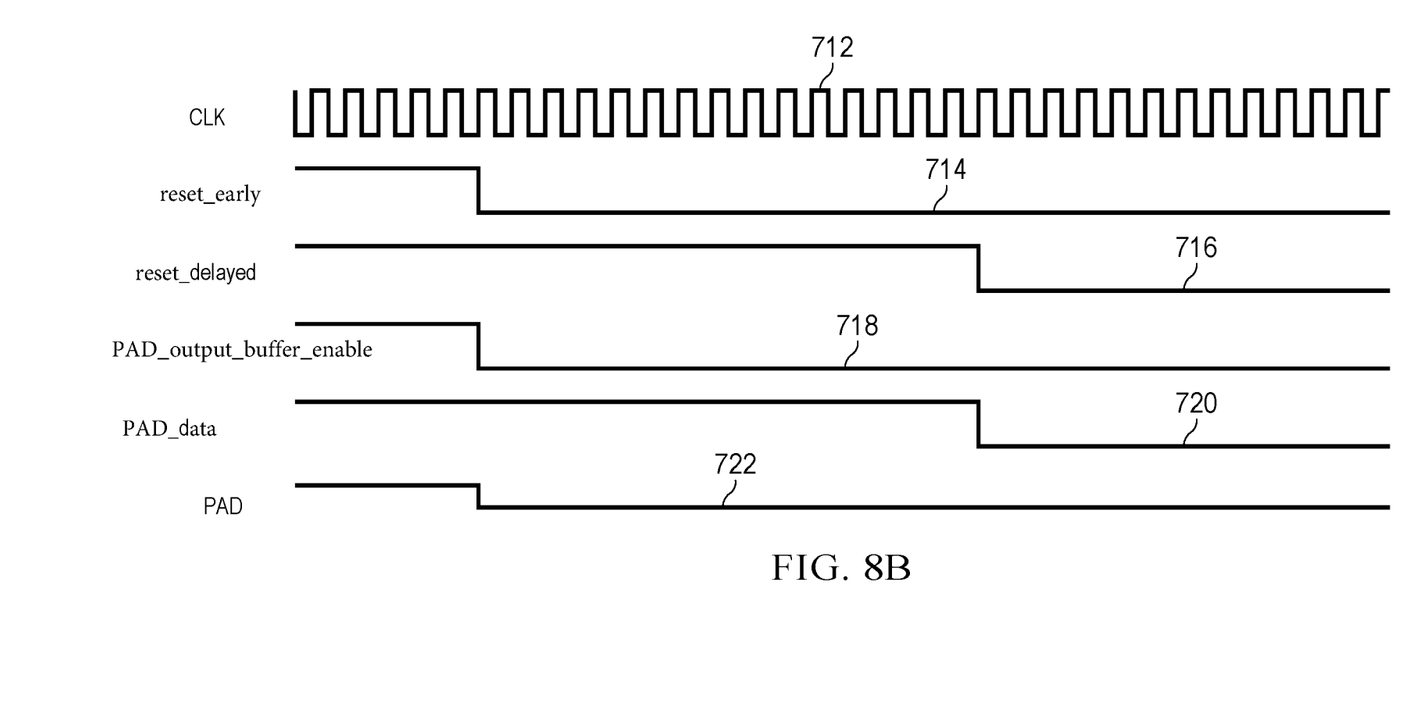
FIG. 8B is a timing diagram showing the operation of some signals of an I/O pad, according to some embodiments.

FIG. 8B is a timing diagram from an RTL simulation showing the operation of some signals of an I/O pad, according to some embodiments. In the timing diagram of FIG. 8B, the early reset signal reset_early 714 is enabled first (by transitioning from a "high" to a "low" value), while the delayed reset signal reset_delayed 716 is enabled afterward. The enabling of the early reset causes 714 the enable PAD_output_buffer_enable signal 718 that enables the tri-state buffer to become de-asserted, which causes the tri-state buffers to become disabled. The normal reset signal reset_delayed 716 being enabled causes the data signal PAD_data 720 to become cleared sometime after the enable signal PAD_output_buffer_enable 718 is disabled.

Because the I/O control is cleared (by the enable signal 718 being deasserted) before the I/O datapath is cleared, then no glitch appears on the PAD signal 722. The glitch that previously appeared in PAD signal 710 of FIG. 8A has been prevented because of the operation of the present embodiment.

In the above figures, the majority of the timing diagrams show the reset signals being enabled by transitioning from a "high" to a "low" state. However, other architectures and embodiments might enable the reset by switching from a "low" to a "high" state. In addition, any of the other signals in the above timing diagrams can be asserted by transitioning from a "low" to a "high" state in some embodiments, or from a "high" to a "low" state in other embodiments. Therefore, the specific implementation details of the above figures should not be construed as limiting.

As such, systems and methods for managing an asynchronous reset in an SoC have been described. In an illustrative, non-limiting embodiment, a reset generation circuit in an SoC, may include: a first reset generation circuit configured to enable a first reset signal based, at least in part, upon a clock signal and an indication to reset. The reset generation circuit may also include: a second reset generation circuit coupled to the first reset generation circuit, wherein the second reset generation circuit is configured to enable a second reset signal after the first reset signal is enabled, and wherein the first reset signal and the second reset signal are both provided to a component of the SoC.

In various implementations the SoC may also include: a phase-locked-loop ("PLL") system comprising a PLL power-down circuit, and a PLL control circuit coupled to the PLL power-down circuit. In some embodiments, the PLL power-down circuit can be configured to: receive the enablement of the first reset signal; and shut down the PLL based on the enablement of the first reset signal. In some additional embodiments, the PLL control circuit can be configured to: receive the enablement of the second reset signal; and clear PLL control signals based at least in part on the enablement of the second reset signal.

In various implementations the SoC may also include: an input/output (I/O) pad comprising one or more tri-state buffers, an enable circuit for the one or more tri-state buffers, and a datapath circuit for the one or more tri-state buffers. In some embodiments, the enable circuit for the one or more tri-state buffers can be configured to: receive the enablement of the first reset signal; and provide a disable signal to the one or more tri-state buffers based at least in part on the enablement of the first reset signal. In some embodiments, the datapath circuit for the one or more tri-state buffers can be configured to: receive the enablement of the second reset signal; and clear data signals to the one or more tri-state buffers based at least in part on the enablement of the second reset signal.

In various implementations, the SoC may also include: a fusebox system comprising a fusebox, a fusebox controller and a fusebox power-switch signal controller. In some embodiments, the fusebox power-switch signal controller can be configured to: receive the enablement of the first reset signal; and provide a power-switch control signal to the fusebox based at least in part on the enablement of the first reset signal. In some embodiments, the fusebox controller can be configured to: receive the enablement of the second reset signal; and clear control signals to the fusebox based at least in part on the enablement of the second reset signal.

In some embodiments, the indication to reset in the reset generation circuit can be an asynchronous indication to reset that is received asynchronously. In some embodiments, the reset generation circuit of part of an automotive SoC for use in automobiles.

In some embodiments, the clock signal is a boot clock signal, the first reset signal and the second reset signal are destructive reset signals. In some of these embodiments, to enable the first reset signal, the first reset generation circuit is further configured to: synchronously enable the first destructive reset signal with the boot clock. In some embodiments, to enable the second reset signal, the second reset generation circuit is further configured to: synchronously enable the second destructive reset signal with the boot clock after the first destructive reset signal is enabled.

In some embodiments, the clock signal is a boot clock signal, the first reset signal and the second reset signal are functional reset signals. In some of these embodiments, to enable the first reset signal, the first reset generation circuit is further configured to: synchronously enable the first functional reset signal with the boot clock. In some embodiments, to enable the second reset signal, the second reset generation circuit is further configured to: synchronously enable the second functional reset signal with the boot clock after the first functional reset signal is enabled.

In some embodiments, the received clock signal is a free running ring oscillator clock for process analysis, and the first reset signal and the second reset signal are power-on-reset signals. In some of these embodiments, to enable the first reset signal, the first reset generation circuit is further configured to: asynchronously enable the first power-onreset signal. In some embodiments, to enable the second reset signal, the second reset generation circuit is further configured to: synchronously enable the second power-on-reset signal with the free running ring oscillator clock after the first power-on-reset signal is enabled.

In another illustrative, non-limiting embodiment, a method may include: based at least in part on a clock signal and an indication to reset, enabling a first reset signal. The method may also include based at least in part on the clock signal and the indication to reset, enabling a second reset signal after the first reset signal is enabled, wherein the first reset signal and the second reset signal are both provided to a component of the SoC.

The method may also include: receiving, by a phase-locked loop (PLL) power-down module of a PLL, the enablement of the first reset signal; shutting down, by the PLL power-down module, the PLL based at least in part on the enablement of the first reset signal; receiving, by a PLL control module of the PLL, the enablement of the second reset signal after the reception of the enablement of the first reset signal by the PLL power-down module; and clearing, by the PLL control module, PLL control signals based at least in part on the enablement of the second reset signal.

The method may also include: receiving, by an enable module for one or more tri-state buffers of an input/output (I/O) pad, the enablement of the first reset signal; providing, by the enable module for one or more tri-state buffers, a disable signal to the one or more tri-state buffers based at least in part on the enablement of the first reset signal; receiving, by datapath module for one or more tri-state buffers of the I/O pad, the enablement of the second reset signal after the reception of the enablement of the first reset signal by the enable module; and clearing, by the datapath module, data signals to the one or more tri-state buffers based at least in part on the enablement of the second reset signal.

The method may also include: receiving, by a fusebox power-switch signal controller of a fusebox system, the enablement of the first reset signal; providing, by the fusebox power-switch signal controller, a power-switch control signal to the fusebox based at least in part on the enablement of the first reset signal; receiving, by a fusebox controller of the fusebox system, the enablement of the second reset signal after the reception of the enablement of the first reset signal by the fusebox power-switch signal controller; and clearing, by the fusebox controller, control signals to the fusebox based at least in part on the enablement of the second reset signal.

In yet another illustrative, non-limiting embodiment, an electronic device may include: a first reset generation component configured to generate a first reset signal and to synchronously enable the first reset signal based at least in part upon an indication to reset. The electronic device may also include a second reset generation component configured to synchronously generate a second reset signal, and to enable the second reset signal after the first reset signal is enabled, where the first reset signal and the second reset signal are both provided to a component of the SoC.

In many implementations, systems and methods described herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, wearable devices, Internet-of-Things (IoT) devices, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

For sake of brevity, conventional techniques related to signal processing, sampling, sensing, analog-to-digital conversion, computer architecture, and PWM, have not been described in detail herein. Furthermore, the connecting lines shown in the various figures contained herein have been intended to illustrate relationships (e.g., logical) or physical couplings (e.g., electrical) between the various elements. It should be noted, however, that alternative relationships and connections may be used in other embodiments. Moreover, circuitry described herein may be implemented either in silicon or another semiconductor material or alternatively by software code representation thereof.

Although the invention(s) are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

The terms "assert" (or "enable" or "set"), and "negate" (or "deassert", "disable" or "clear") are used herein when referring to the rendering of a signal, status bit, or similar apparatus into its logically true or logically false state, respectively. If the logically true state is a logic level one, then the logically false state is a logic level zero. Similarly, if the logically true state is a logic level zero, then the logically false state is a logic level one.

Reference is made herein to "configuring" a device or a device "configured to" perform some operation(s). It should be understood that this may include selecting predefined circuits or logic blocks and logically associating them. It may also include programming computer software-based logic of a retrofit control device, wiring discrete hardware components, or a combination of thereof. Such configured devices are physically designed to perform the specified operation(s).

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A reset generation circuit in a System-On-a-Chip (SoC), comprising:
   a first reset generation circuit configured to enable a first reset signal based, at least in part, upon a clock signal and an indication to reset; and
   a second reset generation circuit coupled to the first reset generation circuit, wherein the second reset generation circuit is configured to enable a second reset signal after the first reset signal is enabled, and wherein the first reset signal and the second reset signal are both provided to a component of the SoC, wherein the component of the SoC is a phase-locked-loop (PLL) comprising:
      a PLL power-down circuit; and
      a PLL control circuit coupled to the PLL power-down circuit.

2. The SoC of claim 1, wherein the PLL power-down circuit is configured to:
   receive the enablement of the first reset signal; and
   shut down the PLL system based on the enablement of the first reset signal.

3. The SoC of claim 2, wherein the PLL control circuit is configured to:
   receive the enablement of the second reset signal; and
   clear PLL control signals based at least in part on the enablement of the second reset signal.

4. The reset generation circuit of claim 1 wherein the indication to reset is received asynchronously.

5. The reset generation circuit of claim 1, wherein the SoC comprises an automotive SoC.

6. The reset generation circuit of claim 1, wherein the clock signal is a boot clock signal, wherein the first reset signal and the second reset signal are destructive reset signals, wherein to enable the first reset signal, the first reset generation circuit is further configured to synchronously enable the first destructive reset signal with the boot clock; and wherein to enable the second reset signal, the second reset generation circuit is further configured to synchronously enable the second destructive reset signal with the boot clock after the first destructive reset signal is enabled.

7. The reset generation circuit of claim 1, wherein the clock signal is a boot clock signal, wherein the first reset signal and the second reset signal are functional reset signals, wherein to enable the first reset signal, the first reset generation circuit is further configured to synchronously enable the first functional reset signal with the boot clock; and wherein to enable the second reset signal, the second reset generation circuit is further configured to synchronously enable the second functional reset signal with the boot clock after the first functional reset signal is enabled.

8. The reset generation circuit of claim 1 wherein the clock signal is a free running ring oscillator clock, wherein the first reset signal is a first power-on-reset signal, wherein the second reset signal is a second power-on-reset signal, wherein to enable the first reset signal, the first reset generation circuit is further configured to asynchronously enable the first power-on-reset signal; and wherein to enable the second reset signal, the second reset generation circuit is further configured to synchronously enable the second power-on-reset signal based, at least in part, upon the free running ring oscillator clock after the first power-on-reset signal is enabled.

9. A reset generation circuit in a System-On-a-Chip (SoC), comprising:
   a first reset generation circuit configured to enable a first reset signal based, at least in part, upon a clock signal and an indication to reset; and
   a second reset generation circuit coupled to the first reset generation circuit, wherein the second reset generation circuit is configured to enable a second reset signal after the first reset signal is enabled, and wherein the first reset signal and the second reset signal are both provided to a component of the SoC, wherein the component of the SoC is an input/output (I/O) pad comprising:
      one or more tri-state buffers, an enable circuit coupled to the one or more tri-state buffers; and
      a datapath circuit coupled to the one or more tri-state buffers.

10. The SoC of claim 9, wherein the enable circuit for the one or more tri-state buffers is configured to:
    receive the enablement of the first reset signal; and
    provide a disable signal to the one or more tri-state buffers based at least in part on the enablement of the first reset signal.

11. The SoC of claim 10, wherein the datapath circuit for the one or more tri-state buffers is configured to:
    receive the enablement of the second reset signal; and
    clear data signals to the one or more tri-state buffers based at least in part on the enablement of the second reset signal.

12. The reset generation circuit of claim 9 wherein the indication to reset is received asynchronously.

13. A reset generation circuit in a System-On-a-Chip (SoC), comprising:
    a first reset generation circuit configured to enable a first reset signal based, at least in part, upon a clock signal and an indication to reset; and
    a second reset generation circuit coupled to the first reset generation circuit, wherein the second reset generation circuit is configured to enable a second reset signal after the first reset signal is enabled, and wherein the first reset signal and the second reset signal are both provided to a component of the SoC, wherein the component of the SoC is a fusebox system comprising: a fusebox, a fusebox controller, and a fusebox power-switch signal controller.

14. The SoC of claim 13, wherein the fusebox power-switch signal controller is configured to:
    receive the enablement of the first reset signal; and
    provide a power-switch control signal to the fusebox system based at least in part on the enablement of the first reset signal.

15. The SoC of claim 14, wherein the fusebox controller is configured to:
    receive the enablement of the second reset signal; and
    clear control signals to the fusebox system based at least in part on the enablement of the second reset signal.

16. The reset generation circuit of claim 13 wherein the indication to reset is received asynchronously.

17. A method, comprising:
    based at least in part on a clock signal and an indication to reset, enabling a first reset signal of a System-On-a-Chip (SoC), wherein the first reset signal is provided to a first portion of a component of the SoC;
    based at least in part on the clock signal and the indication to reset, enabling a second reset signal of the SoC after the first reset signal is enabled, wherein the second reset signal is provided to a second portion of the component of the SoC; and receiving, by the first portion of the component, the enablement of the first reset signal before the second portion of the component receives the enablement of the second reset signal, wherein the component of the SoC is a phase-locked loop (PLL), wherein the first portion of the component is a PLL power-down module of the PLL, and wherein the second portion of the component is a PLL control module of the PLL, wherein the method further comprises:

receiving, by the PLL power-down module of the PLL, an indication of enablement of the first reset signal;

shutting down, by the PLL power-down module, the PLL based at least in part on the enablement of the first reset signal;

receiving, by the PLL control module of the PLL, an indication of enablement of the second reset signal after the reception of the enablement of the first reset signal by the PLL power-down module; and clearing, by the PLL control module, PLL control signals based at least in part on the enablement of the second reset signal.

18. A method, comprising:

based at least in part on a clock signal and an indication to reset, enabling a first reset signal of a System-On-a-Chip (SoC), wherein the first reset signal is provided to a first portion of a component of the SoC;

based at least in part on the clock signal and the indication to reset, enabling a second reset signal of the SoC after the first reset signal is enabled, wherein the second reset signal is provided to a second portion of the component of the SoC; and receiving, by the first portion of the component, the enablement of the first reset signal before the second portion of the component receives the enablement of the second reset signal, wherein the component of the SoC is an input/output (I/O) pad, wherein the first portion of the component is an enable module for one or more tri-state buffers of the I/O pad, and wherein the second portion of the component is a datapath module for the one or more tri-state buffers of the I/O pad, the method further comprising:

receiving, by the enable module for the one or more tri-state buffers of the I/O pad, an indication of enablement of the first reset signal;

providing, by the enable module for the one or more tri-state buffers, a disable signal to the one or more tri-state buffers based at least in part on the enablement of the first reset signal;

receiving, by the datapath module for the one or more tri-state buffers of the I/O pad, an indication of enablement of the second reset signal after the reception of the enablement of the first reset signal by the enable module; and clearing, by the datapath module, data signals to the one or more tri-state buffers based at least in part on the enablement of the second reset signal.

19. A method, comprising:

based at least in part on a clock signal and an indication to reset, enabling a first reset signal of a System-On-a-Chip (SoC), wherein the first reset signal is provided to a first portion of a component of the SoC;

based at least in part on the clock signal and the indication to reset, enabling a second reset signal of the SoC after the first reset signal is enabled, wherein the second reset signal is provided to a second portion of the component of the SoC; and receiving, by the first portion of the component, the enablement of the first reset signal before the second portion of the component receives the enablement of the second reset signal, wherein the component of the SoC is a fusebox system, wherein the first portion of the component is a fusebox power-switch signal controller of the fusebox system, and wherein the second portion of the component is a a fusebox controller of the fusebox system, further comprising:

receiving, by the fusebox power-switch signal controller of the fusebox system, an indication of enablement of the first reset signal;

providing, by the fusebox power-switch signal controller, a power-switch control signal to the fusebox based at least in part on the enablement of the first reset signal;

receiving, by the fusebox controller of the fusebox system, an indication of enablement of the second reset signal after the reception of the enablement of the first reset signal by the fusebox power-switch signal controller; and clearing, by the fusebox controller, control signals to the fusebox based at least in part on the enablement of the second reset signal.

* * * * *